United States Patent
Nagai et al.

(10) Patent No.: US 8,558,450 B2
(45) Date of Patent: Oct. 15, 2013

(54) COLOR CONVERSION FILM USING POLYMERIC DYE, AND MULTICOLOR LIGHT-EMITTING ORGANIC EL DEVICE USING SAME

(75) Inventors: Masaru Nagai, Nagano (JP); Chong Li, Matsumoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 240 days.

(21) Appl. No.: 12/997,250

(22) PCT Filed: Jul. 27, 2009
(Under 37 CFR 1.47)

(86) PCT No.: PCT/JP2009/063359
§ 371 (c)(1),
(2), (4) Date: May 3, 2011

(87) PCT Pub. No.: WO2010/013681
PCT Pub. Date: Feb. 4, 2010

(65) Prior Publication Data
US 2012/0091883 A1    Apr. 19, 2012

(30) Foreign Application Priority Data
Jul. 28, 2008    (JP) .................................. 2008-192998

(51) Int. Cl.
*C09K 11/06* (2006.01)
*C09K 11/00* (2006.01)

(52) U.S. Cl.
USPC . 313/504; 313/502; 252/301.16; 252/301.34; 252/301.35

(58) Field of Classification Search
USPC ................ 313/498–512; 252/301.16, 301.34, 252/301.35; 430/46.3, 507
See application file for complete search history.

(56) References Cited

U.S. PATENT DOCUMENTS

| 5,294,810 | A | 3/1994 | Egusa et al. |
| 5,683,823 | A | 11/1997 | Shi et al. |
| 6,023,371 | A | 2/2000 | Onitsuka et al. |
| 2001/0043043 | A1 | 11/2001 | Aoyama et al. |
| 2003/0184216 | A1 | 10/2003 | Yano et al. |
| 2008/0252198 | A1 | 10/2008 | Katano et al. |

FOREIGN PATENT DOCUMENTS

| JP | 2991450 A | 10/1991 |
| JP | 2000-230172 A | 8/2000 |
| JP | 2000-243563 A | 9/2000 |
| JP | 2002-075643 A | 3/2002 |
| JP | 2003-073479 A | 3/2003 |
| JP | 2003-217859 A | 7/2003 |
| JP | 2005-120209 A | 5/2005 |
| JP | 2005-190667 A | 7/2005 |

(Continued)

*Primary Examiner* — Karabi Guharay
*Assistant Examiner* — Nathaniel Lee
(74) *Attorney, Agent, or Firm* — Rabin & Berdo, P.C.

(57) ABSTRACT

The present invention provides a color conversion film that can maintain sufficient conversion light intensity without increasing the thickness thereof, and a multicolor light-emitting organic EL device that uses such a film. The color conversion film of the invention includes a polymeric dye material that has a weight-average molecular weight of at least 1,000 but not more than 100,000 and that is composed of a first dye unit and a second dye unit. The first dye unit absorbs light incident on the color conversion film and transfers energy of the absorbed incident light to the second dye unit. The second dye unit receives the energy from the first dye unit and emits light.

15 Claims, 3 Drawing Sheets

(56) References Cited

FOREIGN PATENT DOCUMENTS

| | | | |
|---|---|---|---|
| JP | 2005-524725 T | 8/2005 | |
| JP | 2006-504779 T | 2/2006 | |
| JP | 2007-157550 A | 6/2007 | |
| JP | 2007157550 A | * | 6/2007 |
| JP | 2008-103256 A | 5/2008 | |
| WO | WO-2006-103907 A1 | 10/2006 | |
| WO | WO-2006/120954 A1 | 11/2006 | |

* cited by examiner

COLOR CONVERSION FILM USING POLYMERIC DYE, AND MULTICOLOR LIGHT-EMITTING ORGANIC EL DEVICE USING SAME

BACKGROUND OF THE INVENTION

1. Field of the Invention

The present invention relates to a color conversion film which can be fabricated by a coating process and is formed using a polymeric dye material having a high color conversion efficiency. The invention also relates to a multicolor light-emitting organic EL device which is formed using such a color conversion film.

2. Background of the Related Art

Research targeted at the practical application of organic EL elements has been actively carried out in recent years. Because organic EL elements are able to attain a high current density at a low voltage, there is an expectation that such elements will achieve high luminance and luminescence efficiency. The practical use of organic multicolor EL displays capable of high-definition multicolor or full-color display is especially anticipated. One example of a process for achieving an organic EL display capable of multicolor or full-color display is a process that uses a plurality of color filters which allow light of specific wavelengths to pass through (the color filter process). When the color filter process is employed, it is desired that the organic EL element used be one which emits so-called white light; that is, which emits multicolor light that includes a good balance of the three primary colors of light (red (R), green (G) and blue (B)).

Methods that have been investigated for obtaining multicolor light-emitting organic EL elements include a method in which an emissive layer containing a plurality of light-emitting dyes is used and the plurality of light-emitting dyes are subjected to excitation at the same time (see Patent Documents 1 and 2). In another method which uses an emissive layer containing a host light-emitting material and a guest light-emitting material, the host light-emitting material is excited and induced to emit light while at the same time energy transfer is carried out to the guest material, causing it to emit light (see Patent Document 3).

However, the above-described multicolor light-emitting organic EL elements either rely on the simultaneous excitation of a plurality of light-emitting materials or rely on energy transfer between a plurality of light-emitting materials. It has been reported that in such devices the balance of emission intensities between the light-emitting materials changes as the drive time elapses or with changes in the energizing current, which may alter the hue that is obtained.

Another approach that has been proposed for obtaining multicolor light-emitting organic EL elements is a color conversion method which uses both a monochromatic light-emitting organic EL element and a color conversion film (see Patent Documents 4 to 6). The color conversion film used is a layer containing one or a plurality of color conversion substances which absorb short-wavelength light and convert it to long-wavelength light.

Patent Document 1: Japanese Patent No. 2991450
Patent Document 2: Japanese Patent Application Laid-open No. 2000-243563
Patent Document 3: U.S. Pat. No. 5,683,823
Patent Document 4: Japanese Patent Application Laid-open No. 2002-75643
Patent Document 5: Japanese Patent Application Laid-open No. 2003-217859
Patent Document 6: Japanese Patent Application Laid-open No. 2000-230172

However, when a color conversion film is formed using a single color conversion material, molecules of the color conversion material mutually aggregate; as the energy of the absorbed light is repeatedly transferred between the same molecules, a phenomenon known as concentration quenching arises in which the color conversion material deactivates without light emission. To suppress this phenomenon, the color conversion material is dissolved or dispersed in a medium to lower the concentration and thereby suppress contact between molecules of the color conversion material (see Patent Document 5).

Here, lowering the concentration of the color conversion material reduces the absorbance of the light to be absorbed, as a result of which a sufficient conversion light intensity is not obtained. To address this issue, the color conversion film is made thicker, increasing the absorbance and thereby maintaining the efficiency of color conversion. A number of problems are associated with the use of such a thick color conversion film (film thickness, about 10 μm), including the occurrence of electrode pattern disconnects in stepped areas, the difficulty of achieving a high definition, and moisture or solvent residues in the film (when the film is combined with an organic EL device, residual moisture or solvent alters the organic EL layer, resulting in display defects). At the same time, from the standpoint of reducing the viewing angle dependence, there exists a competing desire to make the color conversion film thinner.

It is therefore an object of the present invention to provide a color conversion film which is capable of maintaining a sufficient conversion light intensity without the thickness of the film being increased. A further object of the invention is to provide a color conversion film which can be fabricated by a low-cost wet process. A still further object of the invention is to provide a multicolor light-emitting organic EL device which uses such a color conversion film; that is, to provide a multicolor light-emitting organic EL device which has an excellent viewing angle dependence and, because the hue does not change as the drive time elapses or with changes in the energizing current, exhibits stable emission characteristics over an extended period of time.

SUMMARY OF THE INVENTION

The polymeric dye material that may be used in the color conversion film of the present invention is described below. This polymeric dye material includes, as constituent units within the same molecule, a first dye unit and a second dye unit. The first dye unit absorbs light incident on the color conversion film, and transfers the energy of the absorbed incident light to the second dye unit. The second dye unit receives the energy from the first dye unit and emits light.

The first dye unit is present in an amount, based on the total number of constituent units making up the polymeric dye material, of preferably at least 50% but not more than 99.99%. The second dye unit is present in an amount, based on the total number of constituent units making up the polymeric dye material, of preferably at least 0.01% but not more than 50%. The molecular weight of the polymeric dye material is preferably at least 1,000 but not more than 100,000.

The color conversion film of the present invention is characterized by being formed by coating the foregoing polymeric dye material. The multicolor light-emitting organic EL device of the invention is composed of a pair of electrodes, at least one of which is a transparent electrode; an organic EL layer sandwiched between the pair of electrodes; and a color conversion film. The color conversion film contains the above polymeric dye material and is formed to a film thickness of not more than 2 μm.

The color conversion film making up this multicolor light-emitting organic EL device is preferably formed by a coating process. Also, it is preferable for the color conversion film and the transparent electrode to be arranged so as to be in contact with each other.

In the present invention, by introducing the second dye unit, which is the emission center, onto the polymeric chain, concentration quenching due to the aggregation of the second dye units can be effectively suppressed. In this way, even though the color conversion film is composed of a single material, it is possible to maintain a high color conversion efficiency without increasing the film thickness. Moreover, by selecting a polymeric material that is soluble in a solvent, it is possible to provide a color conversion film which can be formed by a low-cost coating process. Also, the multicolor light-emitting organic EL device formed using such a color conversion film has little viewing angle dependence and, because the hue does not change as the drive time elapses or with changes in the energizing current, exhibits stable emission characteristics over an extended period of time.

DETAILED DESCRIPTION OF THE INVENTION

Figure 1A:
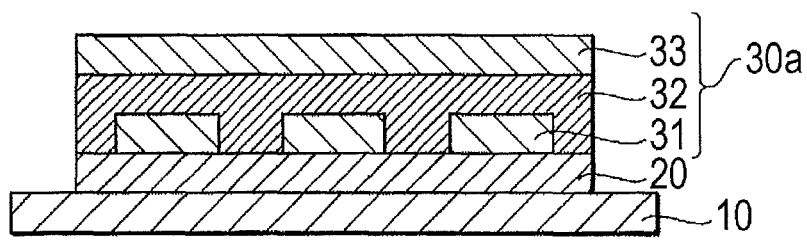
FIG. 1A is a diagram showing an example of configuration according to an embodiment of the multicolor light-emitting organic EL device of the present invention.

A color conversion film according to a first aspect of the invention includes a polymeric dye material composed of a first dye unit and a second dye unit, wherein the first dye unit absorbs light incident on the color conversion film and transfers energy of the absorbed incident light to the second dye unit, and wherein the second dye unit receives the energy from the first dye unit and emits light. It is desirable for the first dye unit to be present within the polymeric dye material in an amount capable of sufficiently absorbing the incident light, which amount is preferably from 50 to 99.9%, based on the total number of constituent units making up the polymeric dye material. It is preferable for the second dye unit to be present in an amount of 50% or less, and preferably from 0.01 to 5%, based on the total number of constituent units making up the polymeric dye material.

The color conversion film of this embodiment has a thickness of not more than 2 μm, and is characterized by formation using a process that involves coating the above-described polymeric dye material.

When fabricated solely, the color conversion film of this aspect of the invention may be fabricated by coating a solution of the polymeric dye material as a solitary film. Alternatively, as subsequently described, the color conversion layer may be formed by coating a solution of the polymeric dye material onto a suitable substrate together with other components.

Materials that may be used as a transparent substrate include glasses and polymeric materials, examples of the latter including cellulose esters such as diacetyl cellulose, triacetyl cellulose (TAC), propionyl cellulose, butyryl cellulose, acetylpropionyl cellulose and nitrocellulose; polyamides; polycarbonates; polyesters such as polyethylene terephthalate, polyethylene naphthalate, polybutylene terephthalate, poly-1,4-cyclohexanedimethylene terephthalate, polyethylene-1,2-diphenoxyethane-4,4'-dicarboxylate and polybutylene terephthalate; polystyrenes; polyolefins such as polyethylene, polypropylene and polymethylpentene; acrylic resins such as polymethyl methacrylate; polycarbonates; polysulfones; polyethersulfones; polyetherketones; polyetherimides; polyoxyethylenes; and norbornene resins. When a polymeric material is used, the transparent substrate may be either rigid or flexible. The transparent substrate has a transmittance to visible light of preferably at least 80%, and more preferably at least 86%.

The polymeric dye material used in the color conversion film of this embodiment includes as constituent units within the same molecule both a first dye unit and a second dye unit. The first dye unit is a unit which absorbs light incident on the color conversion film, preferably blue to blue-green light emitted by an organic EL element, and transfers the energy of the absorbed incident light to the second unit. Therefore, it is desirable for the absorption spectrum of the first dye unit to overlap with the emission spectrum of the organic EL element, and even more desirable for the absorption maximum of the first dye unit to overlap (coincide) with the emission spectrum maximum of the organic EL element. Also, it is desirable for the emission spectrum of the first dye unit to overlap with the absorption spectrum of the second dye unit, and more desirable for the emission spectrum maximum of the first dye to overlap (coincide) with the absorption maximum of the second dye.

Units that can be suitably used as the first dye unit in the invention may be π-conjugation units or may be σ-conjugation units. Examples of π-conjugation units that may be used include p-phenylenevinylene units such as (1,4-phenylene)vinylene (PPV), (2-methoxy-5-(2-ethylhexyloxy)-1,4-phenylene)vinylene (MEH-PPV), (2,5-dialkoxy-1,4-phenylene)vinylene (RO-PPV), cyano-substituted (1,4-phenylene)vinylene (CN-PPV) and 2-dimethyloctylsilyl-1,4-phenylenevinylene (DMOS-PPV); naphthalenevinylene units such as 1,4-naphthalenevinylene (PNV); p-phenylene units such as 1,4-phenylene and 2,5-dialkoxy-1,4-phenylene (RO-PPP), fluorene units; thiophene units such as 3-cyclohexylthiophene (PCHT), 3-cyclohexyl-4-methylthiophene (PCHMT) and 3-alkylthiophene (PAT); and acetylene units such as 1,2-diphenylacetylene (PDPA), 1-n-alkyl-2-phenylacetylene (PAPA) and 2-phenylacetylene (PPA). Abbreviations of the polymers obtained from these units are shown above in parentheses. σ-conjugation units that may be used include silole units.

In addition, copolymers of a plurality of these materials may be used for such purposes as spectrum adjustment and improving the heat resistance. It is desirable for the first dye unit to be present in an amount of from 50 to 99.9%, based on the total number of constituent units in the polymeric dye material. By being present within such a concentration range, the first dye units are able to sufficiently absorb light incident on the color conversion film and transfer the energy of the absorbed incident light to the second dye units.

The second dye unit is a unit which receives energy transferred from the first dye unit, and emits light. Here, as noted above, it is desirable for the emission spectrum of the first dye unit to overlap with the absorption spectrum of the second dye unit, and it is more desirable for the emission spectrum maximum of the first dye unit to overlap (coincide) with the absorption maximum of the second dye unit. Therefore, the light emitted by the second dye unit has a longer wavelength than the light absorbed by the first dye unit. In this invention, examples of dyes that may be suitably used as the second dye unit include perylene dye units; cyanine dye units such as 4-dicyanomethylene-2-methyl-6-(p-dimethylaminostyryl)-4H-pyran (DCM-1; the compound of formula (I) below), DCM-2 (the compound of formula (II) below), and DCJTB (the compound of formula (III) below); 4,4-difluoro-1,3,5,7-tetraphenyl-4-bora-3a,4a-diaza-s-indacene (the compound of formula (IV) below), Lumogen F Red and Nile Red (the compound of formula (V) below). Alternatively, xanthenes dye units such as Rhodamine B and Rhodamine 6G, or pyridine dye units such as Pyridine 1, may be used.

C1:

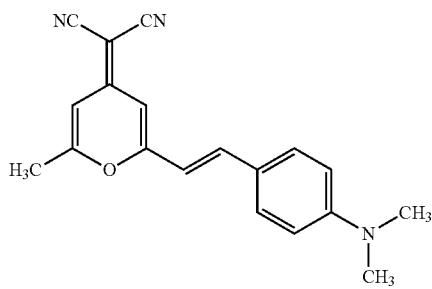

(I)

C2:

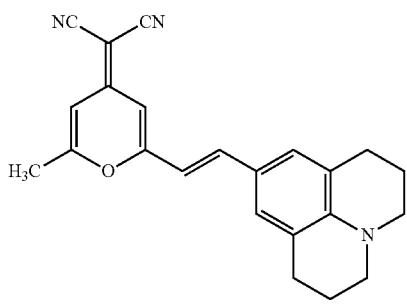

(II)

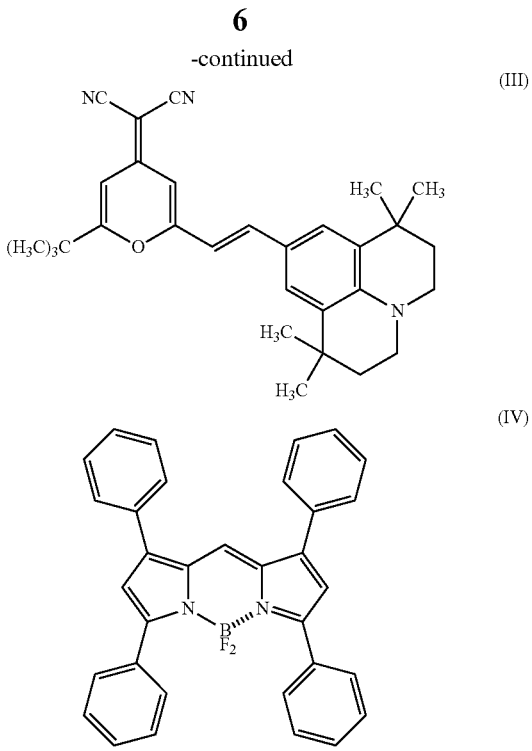

(III)

(IV)

(V)

No particular limitation is imposed on the bonding morphology of the first and second dye units within the polymeric dye material. Use may be made of any of the following: (1) a morphology wherein the first and second dye units together form the main chain, (2) a morphology in which the second dye units are bonded to the ends of a main chain formed of the first dye units, and (3) a morphology in which the second dye units are bonded as side chains to a main chain formed of the first dye units. Examples of the above morphologies (1) to (3) in which fluorene/(2-methoxy-5-(2-ethylhexyloxy)-1,4-phenylene)vinylene is used as the first dye unit and perylene is used as the second dye unit are shown respectively below as structural formulas (a), (b) and (c).

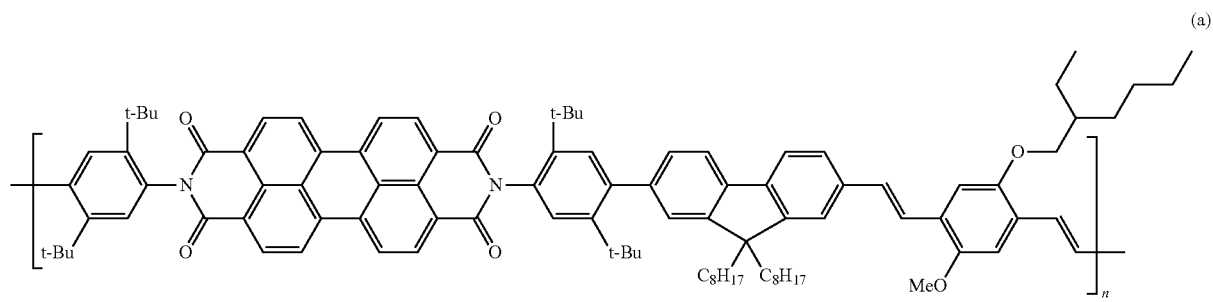

(a)

C3:

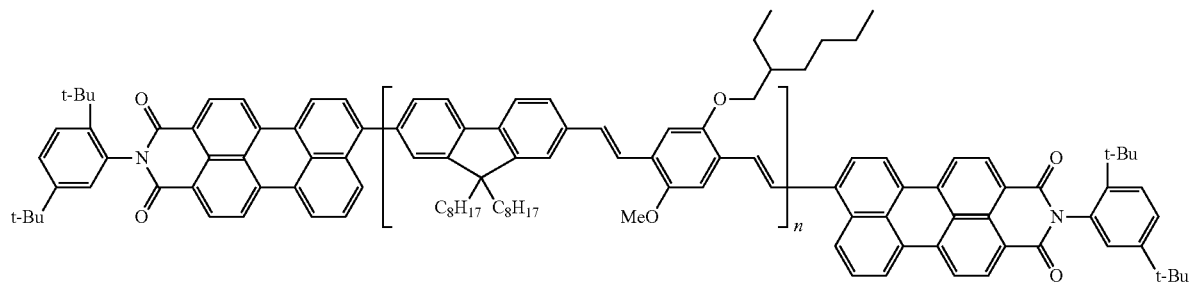

(b)

C4:

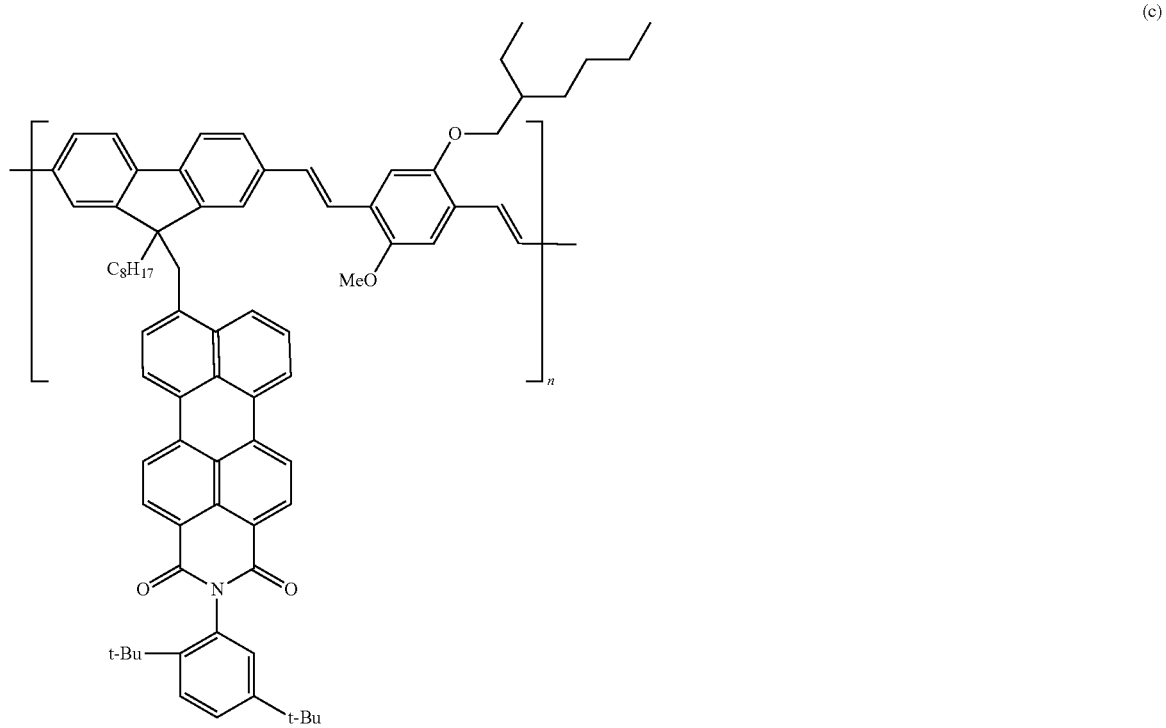

(c)

In the color conversion film of the invention, because the second dye units are the emission centers which emit light, it is important that the second dye units not give rise to concentration quenching. The reason is that, if the second dye units were to give rise to concentration quenching, the color conversion efficiency would decrease. The polymeric dye material used in the color conversion film of the invention, by introducing the second dye units into the polymer chain through chemical bonding, effectively suppresses concentration quenching due to aggregation between the second dye units. However, an excessive increase in the concentration of the second dye units may cause concentration quenching even in such a polymeric dye material. The upper limit in the second dye unit concentration within the color conversion film of the invention may be varied according to the types of first and second dye units, provided the concentration is not such as to cause concentration quenching to occur. The lower limit in the concentration of second dye units may be varied according to the types of first and second dye units or the intended application, provided a sufficient conversion light intensity can be achieved. Generally, the concentration of second dye units in the color conversion film of the invention is preferably not more than 50%, more preferably in a range of from 0.01 to 10%, and even more preferably in a range of from 0.1 to 5%, based on the total number of constituent units in the polymeric dye material. By using the second dye units at a concentration within such a range, a sufficient conversion light intensity can be obtained while at the same time preventing concentration quenching.

As mentioned above, by employing an arrangement in which the absorption of incident light and color conversion are carried out by different types of dye units, the difference between the incident light absorption peak wavelength due to the first dye units and the color-converted light emission peak wavelength due to the second dye units can be made large. In addition, because the functions have been separated, it is possible to broaden the choice of materials used as the first dye units and the second dye units.

The color conversion film of the invention has a thickness of not more than 2,000 nm (2 µm), preferably from 100 to 2,000 nm, and more preferably from 400 to 1,000 nm. Because the first dye units making up the majority of the inventive color conversion film have an incident light-absorbing function, even at such a small thickness, the film has a sufficient absorbance. Although there is no intention here to be limited to any particular theory, it is conceivable that when the first dye units in the color conversion film of the invention have absorbed light and entered into an excited state, energy transfer from the first dye units to the second dye units arises more easily than energy transfer between the first dye units. Hence, the excitation energy of the first dye units does not incur quenching due to transfer between the first dye units (concentration quenching); substantially all of the energy is believed to transfer to the second dye units and thus be capable of contributing to light emission by the second dye units. Then, as noted above, because the second dye units are present in a low concentration which, as noted above, does not give rise to concentration quenching, the transferred excitation energy is efficiently utilized to carry out color conversion, enabling light of the desired wavelength distribution to be emitted. Hence, the color conversion film of the invention is capable of having both a small film thickness and a high color conversion efficiency.

The color conversion film of the invention is preferably formed by a coating process (inclusive of spin coating, ink jetting, spray film forming, and printing processes). When a thin-film is formed by a coating process, if the solution concentration is low, the film formed by a single coating operation will be small, as a result of which a plurality of coating operations may be required to achieve the desired film thickness. Therefore, in order to form a thin-film by a coating process, it is desirable to use a high-concentration solution which has been adapted to the desired film thickness within a range that does not compromise the film properties. Increasing the solution concentration enables the thickness of the thin-film to be increased and the number of coating operations to be reduced. However, a rise in the solution concentration is accompanied by an increased viscosity. Increases in the viscosity of the solution often give rise to problems such as increased resistance within, or obstruction of, pipelines, in the spraying process. In general, the viscosity of a polymer solution is strongly dependent on the molecular weight of the polymeric material; the viscosity rises with increasing molecular weight. Therefore, in order to increase the concentration while holding down the viscosity of the solution, it is effective that the molecular weight of the polymeric material not be excessively large. As a result of extensive investigations, it has been found that, with the polymeric dye material used in the present invention, at a weight-average molecular weight in a range of from 1,000 to 100,000, the viscosity can be held to 20 cp or less, the solution concentration can be set to an elevated concentration of from 5 to 20 wt % and, when film formation is carried out therewith, a film having an excellent resistance to deterioration can be obtained. The weight-average molecular weight of the polymeric dye material used in this invention was measured using a GPC column (Styragel HR5E, available from Waters Corporation) and an HPLC system (600E, available from Waters Corporation). A THF eluant having a flow rate of 1 mL/min was used in these measurements. During such measurements, the above measuring instruments were held at a constant temperature of 40° C. Polystyrene (PS)(TSK standard, available from Tosoh Corporation) was used as the standard substance for molecular weight calculations.

A multicolor light-emitting organic EL device according to a second aspect of the present invention includes an organic EL element and the color conversion film of the first aspect of the invention. The organic EL element is characterized by including a pair of electrodes, at least one of which is transparent, and an organic EL layer sandwiched between the pair of electrodes.

Exemplary configurations of the multicolor light-emitting organic EL device of the present invention are shown in FIGS. 1A to 1D.

The device in FIG. 1A has the following configuration: transparent substrate 10, color conversion film 20, and organic EL element 30a. Here, the organic EL element 30a includes a transparent electrode 31, an organic EL layer 32 and a reflecting electrode 33. The device in FIG. 1A is a so-called bottom emission-type device which has a configuration wherein the color conversion film 20 and the transparent electrode 31 are in contact with each other, and which emits light on the side of the transparent substrate 10. The device in FIG. 1B has the following configuration: substrate 11/organic EL element 30b/color conversion film 20. Here, the organic EL element 30b, as with the element 30a in the previous configuration, includes a transparent electrode 31, an organic EL layer 32 and a reflecting electrode 33, although the stacking order is reversed. The device in FIG. 1B is a so-called top emission-type device which has a configuration wherein the color conversion film 20 and the transparent electrode 31 are in contact with each other, and which emits light on the side opposite from the substrate 11.

Figure 1B:
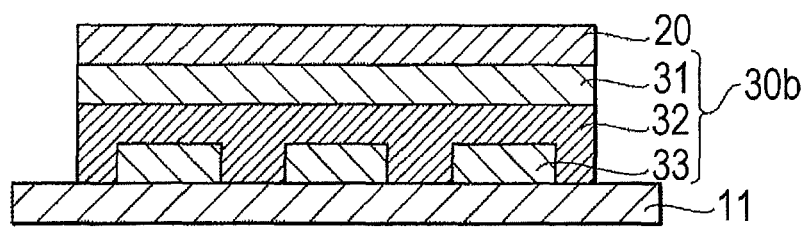
FIG. 1B is a diagram showing an example of configuration according to an embodiment of the multicolor light-emitting organic EL device of the present invention.

In the devices of FIGS. 1A and 1B, one of the pair of electrodes is a transparent electrode 31. Light emitted at the organic EL layer 32 (EL light), either directly or due to reflection at the reflecting electrode 33, radiates in the direction of the transparent electrode 31, and enters the color conversion film 20. Some of the EL light is absorbed by the first dye and, by way of energy transfer to the second dye, is emitted as light having a different wavelength distribution (photoluminescence light, or PL light). These devices then function, by means of the EL light not absorbed by the color conversion film 20 and the PL light, as organic EL devices which emit light in multiple colors.

Figure 1C:
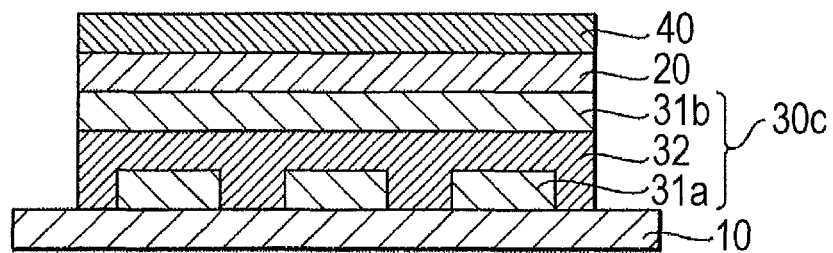
FIG. 1C is a diagram showing an example of configuration according to an embodiment of the multicolor light-emitting organic EL device of the present invention.

The device in FIG. 1C has the following configuration: transparent substrate 10/organic EL element 30a/light conversion film 20/reflecting layer 40. Here, the organic EL element 30c includes a first transparent electrode 31a, an organic EL layer 32 and a second transparent electrode 31b. The device in FIG. 1C is a bottom emission-type device. The device in FIG. 1D has the following configuration: substrate 11, reflecting layer 40, color conversion film 20, and organic EL element 30c. The device in FIG. 1D is a top emission-type device.

Figure 1D:
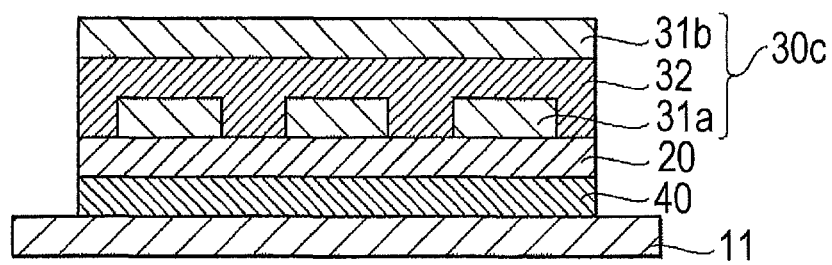
FIG. 1D is a diagram showing an example of configuration according to an embodiment of the multicolor light-emitting organic EL device of the present invention.

In the devices of FIGS. 1C and 1D, the pair of electrodes are both transparent electrodes 31 (a, b), with some of the EL light emitted by the organic EL layer 32 being radiated to the exterior without passing through the color conversion film 20 (in the direction of the transparent substrate 10 in FIG. 1C, and in the direction of the second transparent electrode 31b in FIG. 1D). Of the EL light, some of the light that travels toward the color conversion film 20 is absorbed by the color conversion film 20 and converted to PL light. The light that has passed through the color conversion film 20 is reflected at the reflecting layer 40, again enters the color conversion film 20, incurring a change in wavelength distribution, then passes through the organic EL element 30c and is radiated to the exterior.

In each of the devices in FIGS. 1A to 1D, the color conversion film 20 is arranged so as to be in contact with the transparent electrode 31 (inclusive of the first and second transparent electrodes 31a and 31b). This arrangement minimizes the distance between the organic EL layer 32 and the color conversion layer 20, and is thus effective for increasing the efficiency of EL light incidence to the color conversion film 20 while at the same time reducing the viewing angle dependence.

Which of the above configurations to employ will be determined on the basis of, for example, the desired device application and the hue required of the device. The constituent features of the multicolor light-emitting organic EL devices of this invention are each described below.

The transparent substrate 10 or the substrate 11 must be capable of withstanding the conditions (solvent, temperature, etc.) used in the formation of the layers that are stacked, and preferably has an excellent dimensional stability.

The transparent substrate 10 material used in the bottom emission-type configurations in FIGS. 1A and 1C may be an inorganic material such as glass, or may be a polymeric material, examples of which include cellulose esters such as diacetyl cellulose, triacetyl cellulose (TAC), propionyl cellulose, butyryl cellulose, acetylpropionyl cellulose and nitrocellulose; polyamides; polycarbonates; polyesters such as polyethylene terephthalate, polyethylene naphthalate, polybutylene terephthalate, poly-1,4-cyclohexanedimethylene terephthalate, polyethylene-1,2-diphenoxyethane-4,4'-dicarboxylate and polybutylene terephthalate; polystyrenes, polyolefins such as polyethylene, polypropylene and polymethylpentene; acrylic resins such as polymethyl methacrylate; polycarbonates, polysulfones, polyethersulfones, polyetherketones, polyetherimides, polyoxyethylenes, and norbornene resins. When a polymeric material is used as the transparent substrate 10 material, the transparent substrate 10 may be rigid or flexible. The transparent substrate 10 has a transmittance to visible light of preferably of at least 80%, and more preferably at least 86%.

Because the substrate 11 used in the top emission-type configurations in FIGS. 1B and 1D is not required to have transparency, in addition to the materials that may be used in the above-described transparent substrate 10, it is also possible to use, for example, a metal or a ceramic.

The transparent electrode 31 (inclusive of the first and second transparent electrodes 31a and 31b) has a transmittance to 400 to 800 nm wavelength light of preferably at least 50%, and more preferably at least 85%. The transparent electrode 31 may be formed using an electrically conductive transparent metal oxide such as indium-tin oxide (ITO), tin oxide, indium oxide, indium-zinc oxide (IZO), zinc oxide, zinc-aluminum oxide, zinc-gallium oxide, or any of these oxides to which a dopant such as fluorine or antimony has been added. The transparent electrode 31 is formed by an evaporative deposition process, a sputtering process or a chemical vapor deposition (CVD) process. Formation by a sputtering process is preferred. In cases where, as subsequently described, a transparent electrode 31 composed of a plurality of partial electrodes is required, it is also possible to form the transparent electrode 31 composed of a plurality of partial electrodes by forming the conductive transparent metal oxide uniformly over the entire surface, then carrying out etching so as to impart the desired pattern. Alternatively, the transparent electrode 31 composed of a plurality of partial electrodes may be formed using a mask for imparting the desired shape. Another possibility is to carry out patterning by employing a lift-off process.

The transparent electrode 31 formed from the above-described material is suitable for use as an anode. On the other hand, in cases where the transparent electrode 31 is used as a cathode, it is desirable to enhance the electron injection efficiency by providing a cathode buffer layer at the interface with the organic EL layer 32. The material of the cathode buffer layer is exemplified by, but not limited to, alkali metals such as lithium, sodium, potassium and cesium, alkaline earth metals such as barium and strontium, alloys containing any of these alkali metals or alkaline earth metals, rare earth metals, and fluorides of the foregoing metals. The film thickness of the cathode buffer layer may be suitably selected while taking into account, for example, the driving voltage and the transparency, although it is generally preferable for this layer to have a thickness of not more than 10 nm.

The organic EL layer 32 has a construction which includes at least an organic emissive layer and, where necessary, includes a hole injection layer, a hole transport layer, an electron transport layer and/or an electron injection layer. Alternatively, use may be made of a hole injection and transport layer having both the function of injecting and transporting holes, and an electron injection and transport layer having both the function of injection and transporting electrons. For example, organic EL elements having layer configurations such as the following may be employed.

(1) anode/organic emissive layer/cathode.
(2) anode/hole injection layer/organic emissive layer/cathode.
(3) anode/organic emissive layer/electron injection layer/cathode.
(4) anode/hole injection layer/organic emissive layer/electron injection layer/cathode.
(5) anode/hole transport layer/organic emissive layer/electron injection layer/cathode.
(6) anode/hole injection layer/hole transport layer/organic emissive layer/electron injection layer/cathode.
(7) anode/hole injection layer/hole transport layer/organic emissive layer/electron transport layer/electron injection layer/cathode.

In the above layer configurations, the anode and cathode may each be either a transparent electrode 31 (inclusive of first and second transparent electrodes 31a and 31b) or a reflecting electrode 33.

The materials used in each layer making up the organic EL layer 32 are known materials. For example, preferred examples of the material used in the organic emissive layer for obtaining luminescence which is blue to blue-green include fluorescent whitening agents such as benzothiazole, benzoimidazole and benzoxazole fluorescent whitening agents, metal-chelated oxonium compounds, styrylbenzene compounds and aromatic dimethylidyne compounds.

Oxadiazole derivatives such as 2-(4-biphenyl)-5-(p-t-butylphenyl)-1,3,4-oxadiazole (PBD), triazole derivatives, triazine derivatives, phenylquinoxalines, and the quinolinol complexes of aluminum (e.g., $Alq_3$) may be used as the electron transport layer material. Examples of materials that may be used in the electron injection layer include, in addition to the above-mentioned electron transport layer materials, quinolinol complexes of aluminum that have been doped with an alkali metal or an alkaline earth metal.

Known materials which include triallylamine materials such as TPD, N,N'-bis(1-naphthyl)-N,N'-diphenylbiphenylamine (α-NPD) and 4,4',4''-tris(N-3-tolyl-N-phenylamino)triphenylamine (m-MTDATA) may be used as the hole transport layer material. Materials such as phthalocyanines (e.g., copper phthalocyanine) or indanthrene compounds may be used as the hole injection layer material.

The reflecting electrode 33 is preferably formed using a metal, amorphous alloy or microcrystalline alloy having a high reflectance. Examples of high-reflectance metals include aluminum, silver, molybdenum, tungsten, nickel and chromium. Examples of high-reflectance amorphous alloys include NiP, NiB, CrP and CrB. High-reflectance microcrystalline alloys are exemplified by NiAl. The reflecting electrode 33 may be used as the cathode, or may be used as the anode. When the reflecting electrode 33 is used as the cathode, the efficiency of electron injection to the organic EL layer 32 may be increased by providing the above-described cathode buffer layer at the interface between the reflecting electrode 33 and the organic EL layer 32. Alternatively, when the reflecting electrode 33 is used as the cathode, the electron injection efficiency can be increased by alloying wherein an alkali metal such as lithium, sodium or potassium or an alkaline earth metal such as calcium, magnesium or strontium is added as a low work function material to the above-mentioned metal, amorphous alloy or microcrystalline alloy having a high reflectance. When the reflecting electrode 33 is used as the anode, the efficiency of hole injection to the organic EL layer 32 may be increased by providing the above-described conductive transparent metal oxide layer at the interface between the reflecting electrode 33 and the organic EL layer 32.

Depending on the material used, the reflecting electrode 33 may be formed using any means known to the art, such as evaporative deposition (resistance heating or electron-beam heating), sputtering, ion plating and laser ablation. In cases where, as mentioned subsequently, a reflecting electrode 33 composed of a plurality of partial electrodes is required, a reflecting electrode 33 composed of a plurality of partial electrode may be formed using a mask for imparting the desired shape.

FIGS. 1A to 1D show examples in which, to form a plurality of independent light-emitting regions within the organic EL element 30 (a to c), each of the pair of electrodes is formed of a plurality of parallel stripe-like regions, with the stripes forming one of the electrodes and the stripes forming the other electrode having been formed so as intersect (preferably perpendicularly intersect) each other. These organic EL elements are thus able to carry out matrix driving. That is, when a voltage has been applied to specific stripes on one of the electrodes and specific stripes on the other electrode, the organic EL layer 32 emits light at the regions where these strands intersect. Alternatively, patterning may be carried out in such a way as to make one of the electrodes a uniform and flat electrode having no striped pattern and make the other electrode into a plurality of partial electrodes which correspond to the respective light-emitting regions. In this case, by providing a plurality of switching elements which correspond to the respective light-emitting regions, and connecting the switching elements one-to-one with the partial electrodes which correspond to the respective light-emitting regions, active matrix driving can be carried out. In cases where an organic EL device which uniformly emits light over the entire surface is desired, another possibility is to make each of the pair of electrodes a uniform planar electrode.

The reflecting electrode 40 is preferably formed using the above-mentioned high-reflectance metal (e.g., Al, Ag, Mo, W, Ni, Cr), amorphous alloy (e.g., NiP, NiB, CrP, and CrB), or microcrystalline alloy (e.g., NiAl). Because the color conversion film 20 in this invention is a thin film, the occurrence of a short circuit, through the reflecting layer 40, with the bottom electrode (with 31a) or with the top electrode (with 31b) is also conceivable. To prevent this from happening, an insulating layer may be provided between the reflecting layer 40 and the color conversion film 20, or between the color conversion film 20 and the electrode (the bottom electrode 31a or the top electrode 31b). The insulating layer may be formed using a transparent electrically insulating inorganic substance having a refractive index close to that of the color conversion film 20 (preferably about 1.5 to 2.0), such as $TiO_2$, $ZrO_2$, $AlO_x$, AlN or $SiN_x$.

In the multicolor light-emitting organic EL device of the invention, the quantity of EL light absorbed in the color conversion film 20 can be regulated by changing the type and/or content of the first dye units within the polymeric dye material making up the color conversion film 20 or by adjusting the thickness of the color conversion film 20. Also, the quantity of PL light emitted from the color conversion film 20 can be regulated by adjusting the concentration of second dye units in the polymeric dye material making up the color conversion film 20. In addition to regulation of the quantity of EL light absorbed and the quantity of PL light emitted by these methods, by suitably selecting the arrangement of the color conversion film 20 in the manner shown in FIGS. 1A to 1D, the multicolor light-emitting organic EL device of the invention can be made to emit white light-containing light of any hue.

With regard to the sequential process of absorption by the first dye units, energy transfer from the first dye units to the second dye units, and emission from the second dye units, the efficiency in each of these steps is fixed. That is, the amount of light emitted from the second dye units changes in proportion with the intensity of the EL light. Therefore, in the multicolor light-emitting organic EL device of this invention, even if the intensity of EL light from the emissive layer changes with a change in the driving voltage or an increase in the energizing time, because the intensity of PL light emission also changes in keeping with such a change in the EL light intensity, light of the desired hue can be emitted over a long period of time.

When each of the pair of electrodes is monolithically formed, the multicolor light-emitting organic EL device of the invention may be used as a surface-emitting light source (backlight) for manufacturing a display (a monochrome display, or a multicolor display that also uses color filters). Alternatively, when the pair of electrodes are formed as described above so as to enable matrix driving, the multicolor light-emitting organic EL device of the invention may be used as a monochrome display or as a multicolor display that also uses color filters.

EXAMPLES

Example 1

In the following example, the formation of a color conversion film is described.

Corning 1737 glass with dimensions of 50×50×0.7 mm that had been rinsed with pure water and dried was used as the transparent glass substrate. Using fluorene/(2-methoxy-5-(2-ethylhexyloxy)-1,4-phenylene)vinylene recurring units exemplified by the formula (a) as the first dye units and a perylene compound as the second dye units, a polymeric dye material (weight-average molecular weight, 15,000) having a morphology wherein the second dye units have been introduced onto a main chain of the first dye units was prepared. This polymeric dye material was dissolved in a mesitylene solvent to a concentration of 1 wt %. The glass substrate was set on a spin coater, and the substrate was spun while dripping the polymeric dye solution thereon, thereby forming a uniform film. In the spin coating operation, the substrate was spun for 3 minutes at a spin rate of 800 rpm. The color conversion film of this example, based on the total number of constituent units making up the color conversion film (in this case, the number of all the dye units, including fluorene groups, MEH-PPV groups and perylene groups), contained 2% of perylene groups (i.e., the molar ratio of fluorene groups+MEH-PPV groups to perylene groups was 49:1).

Evaluation 1:

The absorption and photoluminescence (PL) spectra (excitation wavelength, 470 nm) of the color conversion film produced in Example 1 were measured. The resulting spectra are shown in FIG. 2.

Figure 2:
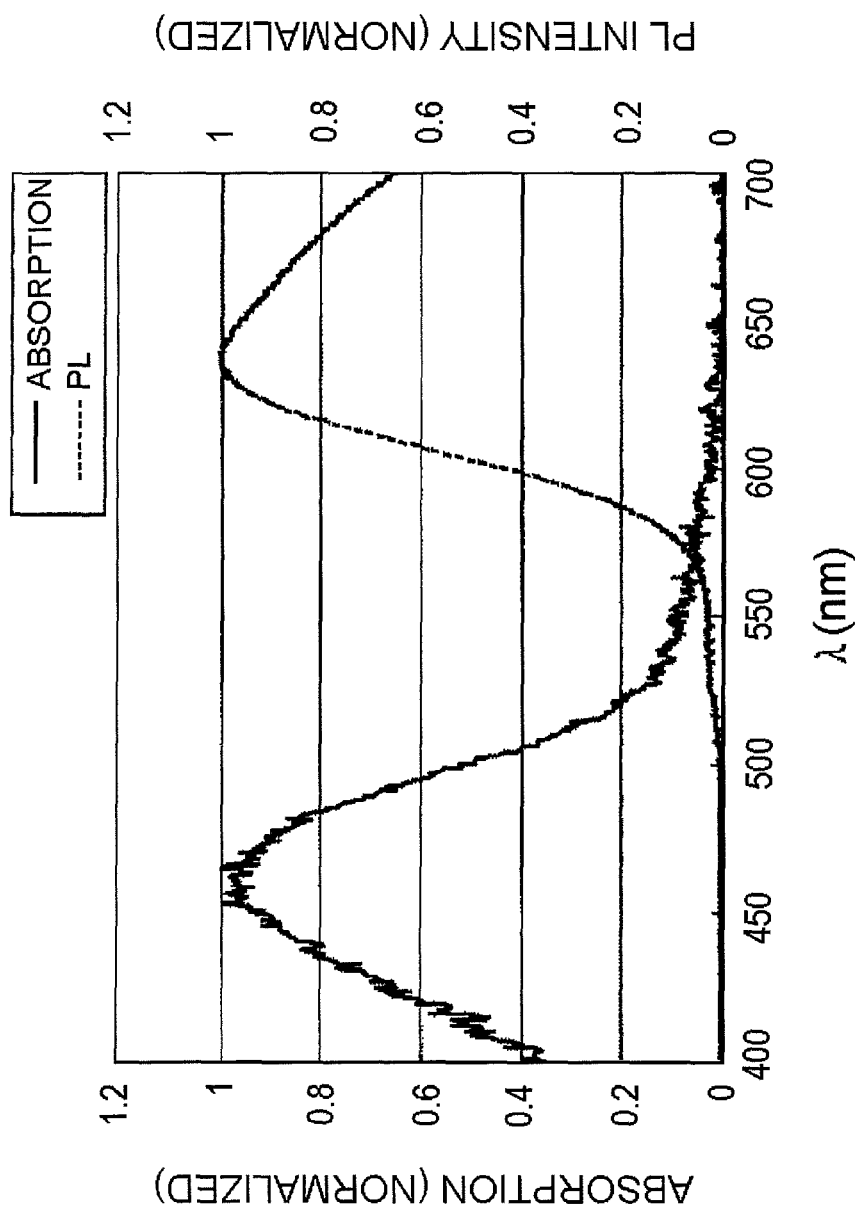
FIG. 2 is a graph showing the absorption and photoluminescence light (PL) spectra for the color conversion film of Example 1.

As is apparent from FIG. 2, the maximum absorption wavelength of the color conversion film in Example 1 is located at 460 nm, and the maximum PL wavelength is located at 640 nm. This shows that the color conversion film has good spectral characteristics as a red conversion film when a blue light-emitting organic EL element is used as the backlight.

The PL quantum yield (excitation wavelength, 470 nm) for the color conversion film fabricated in Example 1 was measured using an integrating sphere. The results obtained are shown in Table 1. For the sake of comparison; the measured PL quantum yield in a solution state is also shown.

TABLE 1

|  | Example 1 | Coating solution |
|---|---|---|
| Quantum yield (%) | 75 | 80 |

As is apparent from Table 1, the color conversion film of Example 1 exhibits a very high PL quantum yield of 75%. At the same time, the PL quantum yield of the polymeric dye solution is 80%. In general, the PL quantum yield of prior-art color conversion films often decreases to from about 60% to about 30% of the PL quantum yield of the solution. This is because interactions between the dyes increase with film formation, giving rise to concentration quenching. By contrast, in the polymeric dye material of the present invention, the decrease in the PL quantum yield associated with film formation is less than 10%. This indicates that the polymeric dye material of the present invention is able to elicit an excellent concentration quenching suppression effect. Such an effect is presumably attributable to the fact that, in the polymeric dye material of the invention, by introducing the second dye units via chemical bonding onto the polymer chain of the first dye units, concentration quenching due to aggregation between second dye units is effectively suppressed.

It is apparent from the above that the color conversion film of Example 1 within the scope of the present invention, by introducing the second dye units via chemical bonding onto the polymer chain of the first dye units, achieves the necessary incident light absorbance and color conversion capability while suppressing concentration quenching, and thus has a practically useful level of performance.

Example 2

This is an example in which the top emission-type device shown in FIG. 1B was fabricated.

Corning 1737 glass with dimensions of 50×50×0.7 mm that had been rinsed with pure water and dried was used as the transparent glass substrate. The transparent glass substrate was carried into a sputtering system, where a CrB film having a thickness of 200 nm was formed using a DC magnetron sputtering process. Following film formation, the substrate was removed from the sputtering system and four stripe-shaped electrodes having linewidths of 2 mm and 2 mm intervals therebetween were formed by a photolithographic process, thereby creating a reflecting electrode. The commercially available photoresist AZ-1500 (AZ Electronics Materials KK) and the commercially available etchant Cr-01 N (Kanto Chemical Co., Inc.) were used in photolithographic patterning.

The substrate on which the reflecting electrode had been formed was carried into a vacuum deposition system. First, a mask having 2 mm wide stripe-shaped openings was placed on the reflecting electrode in a 25×25 mm region at the center of the substrate. Then, through this mask, 1.5 nm of lithium was deposited at the interface with the reflecting electrode, thereby forming a cathode buffer layer.

Next, with the vacuum state held intact, the mask was replaced with a mask having an opening at a 25×25 mm region at the center of the substrate. Four layers (electron transport layer/emissive layer/hole transport layer/hole injection layer) were successively deposited through this mask to form an organic EL layer. Each of the layers was deposited at a deposition rate of 0.1 nm/s. Tris(8-hydroxyquinolinato) aluminum ($Alq_3$) having a film thickness of 20 nm was used as the electron transport layer, 4,4'-bis(2,2'-diphenylvinyl) biphenyl (DPVBi) having a film thickness of 30 nm was used as the emissive layer, 4,4'-bis[N-(1-naphthyl)-N-phenylamino]biphenyl (α-NPD) having a film thickness of 10 nm was used as the hole transport layer, and copper phthalocyanine (CuPc) having a film thickness of 100 nm was used as the hole injection layer.

In addition, with the vacuum state held intact, the substrate on which the organic EL layer had been formed was transferred to a facing target sputtering system. A mask on which 2 mm wide stripe-like openings perpendicular to the reflecting electrode were arranged at 2 mm intervals was then placed thereon. Indium-tin oxide (ITO) was deposited to a film thickness of 200 nm through this mask, thereby giving a transparent electrode.

Next, the substrate on which the transparent electrode had been formed was carried into an inkjet system that had been installed within a glove box into which dry nitrogen (dew point <−40° C.) had been introduced beforehand. The polymeric dye solution used in Example 1 was filled into the inkjet system. Using this inkjet system, a color conversion film having a thickness of 700 nm was formed in a 25×25 mm region at the center of the substrate, and only over the transparent electrode.

Finally, the substrate on which a color conversion film had been formed was removed to a dry atmosphere (moisture concentration <1 ppm; oxygen concentration <1 ppm). A 40×40×0.7 mm sealing glass substrate on which UV-curable adhesive had been coated was laminated onto a four-sided, 3 mm wide region of the substrate so as to seal the structure at and below the color conversion film, thereby giving a multicolor light-emitting organic EL device.

Evaluation 2:

When current was passed through the resulting multicolor light-emitting organic EL device at a current density of 10 $mA/cm^2$, red light at the CIE color coordinates (x, y)=(0.65, 0.35) was emitted. The luminance-current efficiency was 4.5 cd/A. At this time, light emission attributable to the backlight was not confirmed. When an organic EL element was separately fabricated not for the purpose of forming a color conversion film, and the light emission as a backlight alone was measured, blue light was emitted at the CIE color coordinates (x, y)=(0.13, 0.20), and the luminance-current efficiency was 6.2 cd/A. These results showed that the 700 nm thick color conversion film of this example sufficiently absorbs blue light emitted from the emissive layer and radiates high-intensity red light.

Next, a continuous lighting test was carried out by subjecting the multicolor light-emitting organic EL device obtained to constant-current driving at a current density fixed at 0.3 A/cm². The organic EL device of this example did not exhibit any changes in hue with the passage of the driving time over the course of 100 hours of continuous driving. Hence, the organic EL device of this example was found to emit very stable red light.

The invention claimed is:

1. A color conversion film, comprising:
   a polymeric dye material that has a weight-average molecular weight of at least 1,000 but not more than 100,000 and that is composed of a first dye unit and a second dye unit,
   wherein the first dye unit absorbs light incident on the color conversion film and transfers energy of the absorbed incident light to the second dye unit, and
   wherein the second dye unit receives the energy from the first dye unit and emits light.

2. The color conversion film according to claim 1, wherein the first dye unit is present in an amount of at least 50% but not more than 99.99% based on total number of constituent units making up the polymeric dye material.

3. The color conversion film according to claim 2, wherein the film is a coated film formed by a coating process.

4. A multicolor light-emitting organic EL device, comprising:
   an organic EL element including:
      a pair of electrodes, at least one of which is a transparent electrode; and
      an organic EL layer sandwiched between the pair of electrodes; and
   the color conversion film according to claim 2 that has a thickness of not more than 2 μm.

5. The multicolor light-emitting organic EL device according to claim 4, wherein the color conversion film is a coated film formed by a coating process.

6. The multicolor light-emitting organic EL device according to claim 4, wherein the color conversion film and the transparent electrode are arranged so as to be in contact with each other.

7. The color conversion film according to claim 1, wherein the second dye unit is present in an amount of at least 0.01% but not more than 50% based on total number of constituent units making up the polymeric dye material.

8. The color conversion film according to claim 7, wherein the film is a coated film formed by a coating process.

9. A multicolor light-emitting organic EL device, comprising:
   an organic EL element including:
      a pair of electrodes, at least one of which is a transparent electrode; and
      an organic EL layer sandwiched between the pair of electrodes; and
   the color conversion film according to claim 7 that has a thickness of not more than 2 μm.

10. The multicolor light-emitting organic EL device according to claim 9, wherein the color conversion film is a coated film formed by a coating process.

11. The multicolor light-emitting organic EL device according to claim 9, wherein the color conversion film and the transparent electrode are arranged so as to be in contact with each other.

12. The color conversion film according to claim 1, wherein the film is a coated film formed by a coating process.

13. A multicolor light-emitting organic EL device, comprising:
   an organic EL element including:
      a pair of electrodes, at least one of which is a transparent electrode; and
      an organic EL layer sandwiched between the pair of electrodes; and
   the color conversion film according to claim 1 that has a thickness of not more than 2 μm.

14. The multicolor light-emitting organic EL device according to claim 13, wherein the color conversion film is a coated film formed by a coating process.

15. The multicolor light-emitting organic EL device according to claim 13, wherein the color conversion film and the transparent electrode are arranged so as to be in contact with each other.

* * * * *